United States Patent
Behl et al.

(10) Patent No.: US 11,844,200 B2
(45) Date of Patent: Dec. 12, 2023

(54) ELECTROMAGNETIC INTERFERENCE SHIELDING IN RECESSES OF ELECTRONIC MODULES

(71) Applicant: Heraeus Deutschland GmbH & Co. KG, Hanau (DE)

(72) Inventors: Susanne Behl, Hanau (DE); Holger Ulland, Willich (DE); Alan Paul Stadnik, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 397 days.

(21) Appl. No.: 17/031,074

(22) Filed: Sep. 24, 2020

(65) Prior Publication Data

US 2021/0136963 A1    May 6, 2021

(30) Foreign Application Priority Data

Oct. 31, 2019   (EP) .................................... 19206508

(51) Int. Cl.
*H05K 9/00* (2006.01)
*H05K 1/02* (2006.01)
*H05K 3/30* (2006.01)

(52) U.S. Cl.
CPC ........... *H05K 9/0022* (2013.01); *H05K 1/023* (2013.01); *H05K 3/30* (2013.01); *H05K 9/0084* (2013.01); *H05K 2203/1366* (2013.01)

(58) Field of Classification Search
CPC ........ H05K 1/02; H05K 1/023; H05K 1/0218; H05K 1/18; H05K 1/181–187; H05K 3/30; H05K 9/00; H05K 9/022; H01L 23/30–31; H01L 23/38; H01L 23/60; H01L 23/552–556; H01L 23/561
(Continued)

(56) References Cited

U.S. PATENT DOCUMENTS 8,598,690 B2 * 12/2013 Chandra ............... H01L 21/561
                                                    174/394
10,784,210 B2 * 9/2020 Kim ........................ H01L 23/28
(Continued)

FOREIGN PATENT DOCUMENTS

CN          104716104          6/2015
EP          1622435 A1         2/2006
(Continued)

OTHER PUBLICATIONS

Taiwanese Office Action dated Aug. 22, 2021 for Taiwanese Patent Application No. 109133236.
(Continued)

*Primary Examiner* — Tuan T Dinh
(74) *Attorney, Agent, or Firm* — Panitch Schwarze Belisario & Nadel LLP

(57) ABSTRACT

An electronic module having at least two electronic components mounted on a substrate. The electronic components are covered by a dielectric material. The dielectric material has a recess between adjacent electronic components. The surface of the recess facing at least one electronic component is coated with a conductive layer while the opposite surface to that coated recess surface is substantially free of a conductive layer. Also disclosed is a process for making the above-specified electronic module.

20 Claims, 6 Drawing Sheets

(58) Field of Classification Search
USPC .................. 361/764, 767, 784, 816, 818;
257/680–690, 787–790; 174/520
See application file for complete search history.

(56) References Cited

U.S. PATENT DOCUMENTS

| | | | |
|---|---|---|---|
| 11,088,082 B2* | 8/2021 | Kim | H01L 21/561 |
| 2006/0151203 A1* | 7/2006 | Krueger | H03H 9/1071 |
| | | | 29/841 |
| 2006/0197220 A1 | 9/2006 | Beer | |
| 2006/0221591 A1* | 10/2006 | Kong | H05K 1/0218 |
| | | | 361/818 |
| 2006/0274517 A1* | 12/2006 | Coffy | H01L 23/552 |
| | | | 174/262 |
| 2007/0056768 A1 | 3/2007 | Hsieh et al. | |
| 2011/0006408 A1* | 1/2011 | Liao | H01L 21/565 |
| | | | 257/E23.114 |
| 2014/0054802 A1 | 2/2014 | Shim et al. | |
| 2015/0043189 A1* | 2/2015 | Kitazaki | H05K 3/244 |
| | | | 29/832 |
| 2015/0171020 A1 | 6/2015 | Shibuya et al. | |
| 2017/0077039 A1* | 3/2017 | Liao | H01L 23/552 |
| 2018/0090449 A1* | 3/2018 | Jeong | H01L 23/552 |
| 2019/0051611 A1* | 2/2019 | Kim | H01L 23/3128 |
| 2019/0103365 A1 | 4/2019 | Singh et al. | |

FOREIGN PATENT DOCUMENTS

| | | |
|---|---|---|
| JP | 2006013375 | 1/2006 |
| JP | 2010067732 | 10/2013 |
| WO | 2018069448 | 4/2018 |

OTHER PUBLICATIONS

Japanese Office Action dated Aug. 17, 2021 for Japanese Patent Application No. 2020-158265.

* cited by examiner

ELECTROMAGNETIC INTERFERENCE SHIELDING IN RECESSES OF ELECTRONIC MODULES

RELATED APPLICATION

This application claims the benefit of priority to European Patent Application No. 19206508.4 filed on Oct. 31, 2019, the contents of which are incorporated in this application by reference.

TECHNICAL FIELD

The present disclosure relates to an electronic module having a conductive layer, a process for producing such a module and the use of the module.

BACKGROUND OF THE DISCLOSURE

In the field of electronic devices individual modules become smaller and smaller and the distances between electronic components within the modules are continuously reduced. Such electronic modules typically include a substrate, electronic components or groups of components which are mounted on the substrate and a dielectric material covering or embedding the electronic components.

The substrate acts as a carrier and at the same time typically hosts the connections and wires between the electronic components. The electronic components usually have different functions in an electronic circuit and often contain semiconductor chips and the like. The dielectric material is mainly used to protect sensitive electronic components from environmental influences like, e.g., humidity or oxygen.

Such electronic modules are sometimes called system-in-packages (SIP) or semiconductor packages. The ongoing miniaturization of the modules makes it increasingly difficult to shield electronic components which are sensitive to electromagnetic interferences (EMI) from sources of electromagnetic radiation, especially in the range of radio frequencies. Examples of components that are susceptible to radio frequency interference include radio-frequency transceiver circuits. Clock signals are another example of sources of radio frequency interference.

EMI shielding can reduce the exposure to electromagnetic interference for single electronic components or for electronic component groups. Shielding is preferably done by applying a conformal conductive layer on the surface of the dielectric material of the module. In some cases, it may be required within the same electronic module to protect groups of electronic components from electromagnetic interference while other electronic components remain unprotected, like for example antennas. This is typically done by introducing recesses in the dielectric material between adjacent electronic components. Typically, the recesses are trenches which are created by a thin dicing saw blade or a laser. The recesses are then filled with a conductive material or the recess surfaces are coated with a conductive material. Since the recesses between electronic components are getting smaller and smaller in order to build more compact modules it gets increasingly difficult to introduce conductive layers with EMI shielding properties in between adjacent components inside those recesses. Typical widths of recesses, in particular trenches, are in the range from 10 μm to 150 μm.

The introduction of conductive material into a recess is typically done by filling with a conductive paste or by vapor deposition techniques. For example, EP1622435A1 describes the filling of trenches with a metal particle ink or conductive polymer. Both techniques have severe drawbacks.

Vapor deposition techniques like chemical vapor deposition or physical vapor deposition are expensive due to the use of vacuum technology. Furthermore, vapor deposition only allows for the coating of the complete surface of the recesses. In cases where a partial coating is required, expensive masking techniques have to be used.

On the other hand, filling techniques have the drawback that they utilize more conductive material than is technically needed to ensure EMI shielding. Filling techniques have the additional drawback that they are slow because the recess is filled in several sequential steps which each involves application and curing of the filled material.

It is an object of the present invention to solve at least one of the abovementioned problems.

In particular it is an object of the invention to provide a material-efficient coating of a recess between adjacent electronic components with a conductive layer.

It is a further object of the invention to provide high quality EMI shielding to EMI-sensitive electronic components in an electronic module.

It is a further object of the invention to provide a fast process for equipping a recess between adjacent electronic components with a conductive layer.

It is a preferred object of the invention to provide a process which allows for the location-specific application of an EMI shielding layer.

It is a preferred object of the invention to provide a process for producing a conductive layer on the surface of a recess wherein the recess in at least one cross section perpendicular to the substrate surface has an aspect ratio of 7 or less.

SUMMARY OF THE DISCLOSURE

A contribution to the at least partial fulfilment of at least one, preferably several, of the above objects is provided by the following twenty-five disclosed embodiments.

I. An electronic module having at least two electronic components mounted on a substrate, wherein the electronic components are covered by a dielectric material, wherein the dielectric material comprises a recess between adjacent electronic components, characterized in that the surface of the recess facing at least one electronic component is coated with a conductive layer while the opposite surface to that coated recess surface is substantially free of a conductive layer.

II. An electronic module according to embodiment I wherein the recess in at least one cross section perpendicular to the substrate plane has an aspect ratio of 7 or less.

III. An electronic module according to embodiment I or II, wherein one electronic component of the electronic module is a component emitting electromagnetic radiation, preferably a radio frequency transmitter.

IV. An electronic module according to any of embodiments I-III, wherein the dielectric material is a polymeric material.

V. An electronic module according to any of embodiments I-IV, wherein the polymeric material is a crosslinked resin.

VI. An electronic module according to any of embodiments I-V, wherein the recess is a trench.

VII. An electronic module according to any of embodiments I-VI, wherein the substrate is a printed circuit board.
VIII. An electronic module according to any of embodiments I-VII, wherein the bottom of the recess is coated with a conductive layer.
IX. An electronic module according to any of embodiments I-VIII, wherein the recess in at least one cross section perpendicular to the substrate surface has an aspect ratio of 5 or less, preferably 3 or less.
X. An electronic module according to any of embodiments I-IX, wherein the conductive layer comprises a metal or consists of metal.
XI. An electronic module according to any of embodiments I-X, wherein the full width at half-maximum of the recess is in the range from 20-400 μm, preferably from 50-250 μm.
XII. An electronic module according to any of embodiments I-XI, wherein the conductive layer of the recess surface is part of an electromagnetic interference shielding for at least one electronic component of the electronic module.
XIII. An electronic module according to any of embodiments I-XII, wherein the electromagnetic interference shielding has a sheet resistance of 20 mOhm/□ or less.
XIV. An electronic module according to any of embodiments I-XIII, wherein the conductive layer has a dampening factor for radiation with frequencies above 1 GHz of at least 20 dB.
XV. An electronic module according to any of embodiments I-XIV, wherein the thickness of the conductive layer on the surface of the recess is 5 nm or more and 5 μm or less.
XVI. An electronic module according to any of embodiments I-XV, wherein the thickness of the conductive layer outside the recess, if present, and the thickness of the conductive layer in the recess do not differ by more than a factor of three, preferably not more than two.
XVII. A process for producing an electronic module having at least two electronic components mounted on a substrate, wherein the electronic components are covered by a dielectric material, wherein the electronic module comprises a recess in the dielectric material between adjacent electronic components, wherein the surface of the recess facing at least one electronic component is coated with a conductive layer while the opposite surface to that coated recess surface is substantially free of a conductive layer and wherein the conductive layer is produced by inkjet printing of an ink composition.
XVIII. A process according to embodiment XVII, wherein inkjet printing utilizes at least one nozzle and the at least one nozzle is configured such that the inkjet ejected by the at least one nozzle hits the surface of the recess to be coated at an angle theta (θ) of 5°-15° relative to the surface.
XIX. A process according to embodiment XVII or XVIII, wherein the recess in at least one cross section has an aspect ratio of 7 or less, preferably 5 or less and especially 3 or less.
XX. A process according to any of embodiments XVII-XIX, wherein the ink composition comprises at least these constituents:
a) A compound comprising at least one metal precursor or a combination of two or more thereof; and
b) At least one organic compound, which is a liquid at room temperature and ambient pressure and which is preferably a volatile organic compound.)
XXI. A process according to any of embodiments XVII-XX, wherein the at least one metal precursor comprises at least one element selected from the group consisting of silver, gold and copper.
XXII. A process according to any of embodiments XVII-XXI, wherein the organic compound comprises an organic solvent.
XXIII. A process according to any of embodiments XVII-XXII, wherein the ink composition has a viscosity in the range of from 0.1 to 100 mPas, e.g., from 5 to 70 mPas, determined at a temperature of 20° C. and an environmental pressure of 1,013 hPa.
XXIV. Use of the electronic module according to any of embodiments I-XVI in a computer device.)
XXV. Use according to embodiment XXIV, wherein the computer device is selected from the group consisting of a phone, a tablet computer, a notebook, a wearable preferably a watch, an embedded computer or a desktop computer.

It is to be understood that both the foregoing general description and the following detailed description are exemplary, but are not restrictive, of the disclosure.

BRIEF DESCRIPTION OF THE DRAWING

The invention is described in more detail below by examples and figures, wherein the examples and figures do not constitute a limitation of the invention. Furthermore, the figures are not to scale, unless otherwise indicated. Included in the drawing are the following figures.

DETAILED DESCRIPTION OF THE DISCLOSURE

Figure 1:
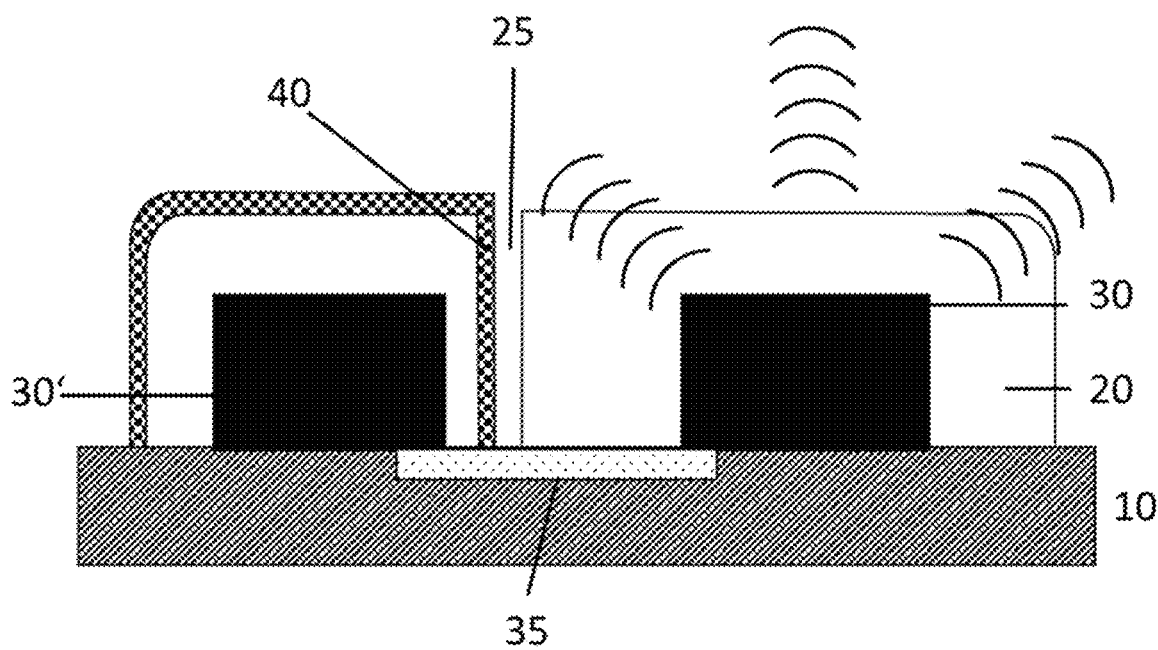
FIG. 1 shows a schematic drawing of an electronic module according to an embodiment of the invention.

The term "adjoins" with respect to the relation of a layer and a dielectric material is used in the present context to describe that the layer overlays the dielectric material and is entirely connected with the dielectric material's surface. "Entirely" means that merely small disconnected spots may remain due to defects of the application process or because of unwanted particles on the dielectric material. However, it is preferred that the defects do not decrease the EMI shielding effect. A layer which adjoins a dielectric material is often also referred to as a "conformal layer."

Room temperature equates to 20° C. (+293° K). The term "ambient pressure" stands for an absolute pressure of 1,013 hPa. Standard humidity in the present context is 50% relative humidity if not indicated otherwise. The conductance of silver is $6.14 \cdot 10^7$ A·m/V, at 20° C.

A liquid in the present context describes a substance or a composition having more than one constituent which has a viscosity in the range from 0.1 to 300 mPas, determined according DIN 53019-1:2008 at 20° C. The viscosity in the context of this invention is measured using a Brookfield DV3 rheometer, spindle Nr. 21, at 100 rpm and 20° C.

The term volatile refers to an organic chemical compound or composition which has a beginning boiling point of 250° C. at most at ambient pressure.

Conductive in the present context refers always to electric conductance. An article or a structure, e.g., a layer is electrically conductive when its bulk electrical conductance σ at 25° C. equals to or exceeds $1 \cdot 10^6$ S/m. The bulk electrical conductance is determined using a four point probe system available from Ossila of Sheffield, UK after measuring the median film thickness with a Dektak DXT-E profilometer.

Ranges mentioned in the present context include the values specified as limits. Thus, an indication of the type "in the range from X to Y" with respect to a size A means that A can assume the values X, Y and values between X and Y. One-sided limited ranges of the type "up to Y" for a size A include in analogous manner the value of Y and those values smaller than Y.

The term "electromagnetic interference" (EMI) shall describe broadband wave form signals, including radio-frequency (RF) signals and other frequency signals that emanate from components in the electronic module or from other sources. Radio-frequency may be understood as electromagnetic radiation between 100 MHz and 300 GHz.

EMI shielding in the context of this invention is to be understood as a dampening of radio frequency signals by at least 5 dB, preferably 10 dB and most preferably at least 30 dB.

A first aspect of the invention is related to an electronic module having at least two electronic components mounted on a substrate, wherein the electronic components are covered by a dielectric material, wherein the dielectric material comprises a recess between adjacent electronic components, characterized in that the surface of the recess facing at least one electronic component is coated with a conductive layer while the opposite surface to that coated recess surface is substantially free of a conductive layer.

An effect of the invention is that the amount of metal material consumed for producing a conductive layer can be significantly reduced, compared to filling techniques.

In an embodiment of the invention the at least one electronic component of the electronic module may be selected for example from the group consisting of semiconductor chips, transmitters, receivers and antennas.

The substrate is preferably made from an insulating material, like for example fiber enforced polymer resin and in particular fiberglass filled epoxy resin. In a preferred embodiment of the invention the substrate is a printed circuit board. Preferably the substrate is plane on the side which hosts the electronic components.

The electronic components on the substrate are covered by a dielectric material. In a preferred embodiment the components may be embedded in the dielectric material. This kind of embedding is sometimes also termed molding. The dielectric material is also sometimes termed a "mold." The dielectric material covering the electronic components of the electronic module can be of any type known in the art.

In some embodiments the dielectric material comprises or consists of a polymeric material. More preferably the polymeric material may be a crosslinked polymer resin. In one embodiment of the present invention the polymeric material can be selected from the group consisting of epoxy resins, acrylic resins, phenol novolac resins, bi phenylic resins or combinations thereof. Acrylic resins may include acrylate resins or methacrylate resins.

In some embodiments of the invention the dielectric material may contain organic or inorganic filler materials. Examples of inorganic fillers are silica or alumina particles.

The electronic module of the invention comprises a recess in the dielectric material between adjacent components. In a preferred embodiment the recess is present between adjacent electronic components on a printed circuit board.

Figure 4:
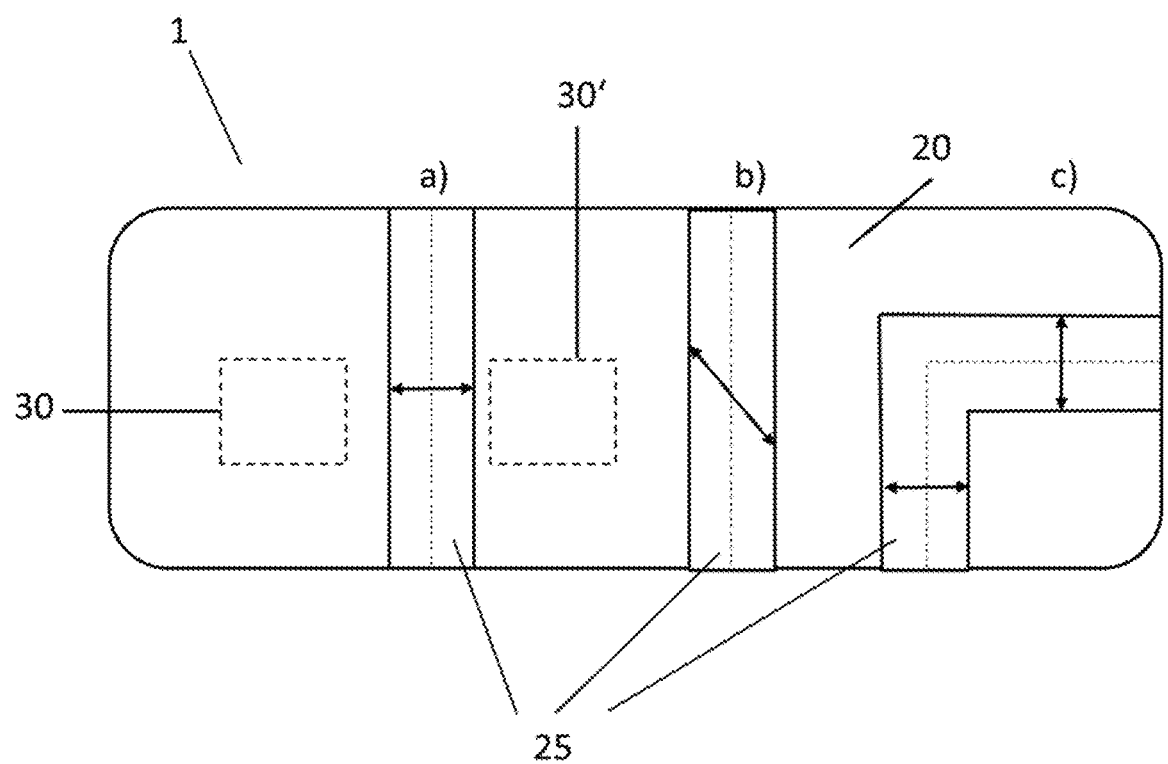
FIG. 4 shows a top view of the electronic module having several recesses in the form of trenches.

In a further preferred embodiment of the present invention the recess is a trench. In an embodiment of the invention the trench extends along a straight line or the trench extends along an angled line. In this regard reference is made to FIG. 4. FIG. 4 shows a top view on the electronic module having three recesses a-c). Exemplary scenarios a) and b) each show a trench extending along a straight line (dashed). Scenario c) gives an example of a trench extending along an angled line.

In some embodiments the recess surface comprises or consists of dielectric material. The surface finish of the dielectric material in the recess (e.g., roughness) may for example originate directly from the process of the recess formation (e.g., sawing or laser ablation). In some embodiments of the invention the surface of the recess may be cleaned, e.g., by plasma cleaning with parameters known in the art.

The preparation of the recess can be done in several ways. For example, the recess can be formed by laser ablation or with a thin dicing saw blade. In particular laser ablation allows for the preparation of very narrow recesses with very high aspect ratios, for example aspect ratios of 3 or more. The recess may in some embodiments have a rectangular cross section or it may comprise a round bottom region. The opposite surfaces of the recess may be strictly parallel to each other or one or both surfaces of the recess may be tilted. For example, the tilt of the surfaces may be in the range from 1-5° relative to each other. Preferably the recess of the invention does not have a higher width at the bottom than at the opening.

The recess in at least one cross section perpendicular to the substrate surface has an aspect ratio of 7 or less, preferably of 5 or less and more preferably of 3 or less. At the same time the aspect ratio of the cross section of the recess in some examples may be 0.1 or more, preferably 0.5 or more and in particular 1 or more.

Figure 5:
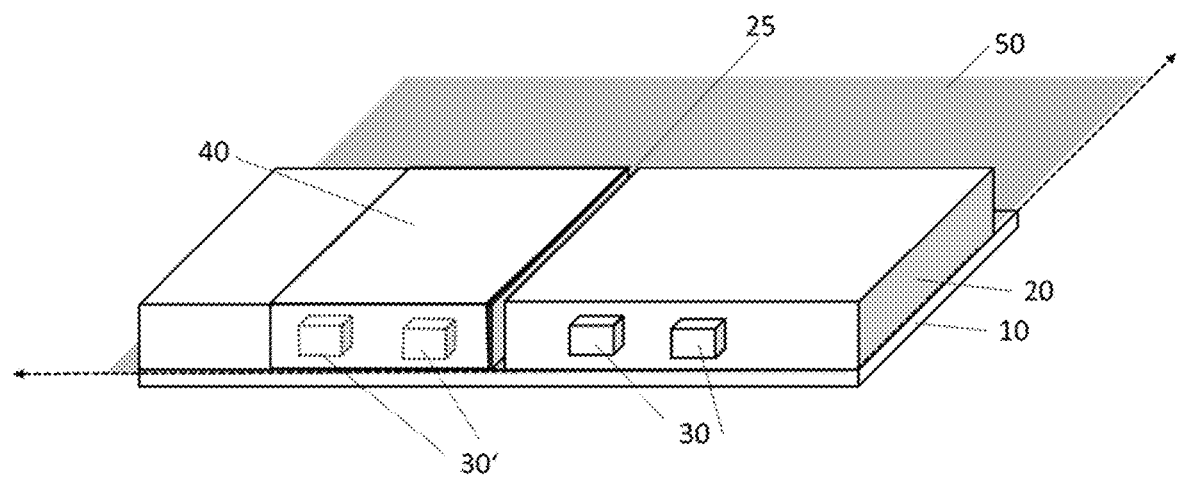
FIG. 5 shows a schematic perspective view of an electronic module according to an embodiment of the invention.

For the determination of the cross section of the recess the plane parallel to the substrate is determined. This plane parallel to the substrate is also termed the substrate plane 50. An exemplary orientation of the substrate plane is depicted in FIG. 5. The substrate plane 50 is determined from the bare substrate surface without any electronic connections or components attached to it. Preferably the substrate plane 50 extends parallel to the surface of a printed circuit board. In the example of a printed circuit board the surface plane extends along the surface of the resin material of the bare board. This would not consider any bumps or dips resulting from conductors on the printed circuit board.

The cross section of the recess is oriented perpendicular to the substrate plane 50. Preferably the cross section extends along the shortest distance between two opposite surfaces of the recess. In this context reference is made to FIG. 4. FIG. 4 shows a top view on the electronic module having recesses a) to c). Scenario a) shows the shortest distance between opposite surfaces while scenario b) shows an unfavorable longer cross section. The two-headed arrows indicate the directions of the cross section standing perpendicular on the substrate plane 50. In an embodiment of the invention for determining the cross section the opposite surfaces of the recess are oriented parallel to each other. Typically, this gives the shortest distance between opposite surfaces and results in the highest aspect ratios as will be explained below.

The aspect ratio of the recess in this invention is calculated as the depth of the recess divided by the full width at half-maximum of the recess. In this regard reference is made to FIG. 2. The depth d of the recess 25 is defined as the distance from the surface level 60 of the module to the deepest spot of the recess. The full width w at half maximum d/2 is the shortest distance between opposite surfaces at the half distance of the depth of the recess. In particular the opposite surfaces of the recess are parallel to each other when determining the full width of the recess at half-maximum.

In a preferred embodiment of the invention the surfaces of the recess are oriented at an angle of 90°-5° with respect to the surface plane 50 of the substrate.

In an embodiment of the invention the full width at half-maximum of the recess amounts to at least 20 μm, preferably to at least 50 μm, most preferably to at least 100 μm. At the same time the maximum full width at half-maximum may be at most 400 μm, preferably at most 250 μm and more preferably at most 150 μm.

In an embodiment of the invention the surface of the recess facing at least one electronic component is coated with a conductive layer while the opposite surface to that coated recess surface is substantially free of a conductive layer. Preferably the conductive layer adjoins at least a part of the surface of the recess. The adjoining conductive layer on the surface of the recess preferably forms a conformal layer. In this context the term "substantially free" means that the opposite surface does not exhibit a continuous conductive layer over this opposite surface of the recess. In particular this opposite surface does not exhibit a layer which provides EMI shielding properties. This scenario may not exclude that some traces or isolated spots of conductive material which stem from the ink composition are present on this "substantially free" surface.

Preferably at least 70%, more preferably at least 85% and most preferably at least 95% of the surface of the recess facing an electronic component is coated with a conductive layer.

In some embodiments of the invention the bottom of the recess is additionally coated with a conductive layer. Alternatively, the bottom of the recess may be free of any conductive layer. Furthermore, the conductive layer is preferably electrically connected to a conductive layer outside the recess, e.g., a conductive layer on the top surface of the electronic module or on the side surfaces of the electronic module. Even more preferred the conductive layer of the invention is in electrical contact with the electrical ground of the electronic module.

In some embodiments, the conductive layer has a thickness of 5 μm at most, for example in the range from 5 nm to 5 μm, or from 50 nm to 2 μm, or from 100 nm to 1 μm. For example, the conductive layer on the coated surface of the recess may have a thickness in the range from 500 nm to 5 μm.

When the conductive layer becomes too thick (e.g., >5 μm) it might not be producible as a single ink jetted layer any more. Very thin layers (e.g., <5 nm) can lack some electromagnetic interference shielding efficiency. However, thinner layers of electromagnetic interference shielding material are more tolerant to deformation because of a larger window of plastic deformation. This can reduce a tendency of the layer to delaminate, to undergo package warping and so on. In some embodiments, the thickness of the conductive layer of the invention varies for 50% at most.

In a further embodiment of the invention the conductive layer has a sheet resistance of 20 mOhm/□ or less. In some embodiments the conductive layer may have a conductivity of at least 5%, for example at least 10%, or at least 20%, or at least 30%, or at least 50%, or in the range from 20 to 50%, or from 25 to 40%, always with respect to the conductivity of the bulk metal, which constitutes the electromagnetic interference shielding layer; the conductivity can sometimes reach values of up to 100%, e.g., up to 90%, based on the conductivity of the bulk metal, which metal constitutes the electromagnetic interference shielding layer.

In a further embodiment of the invention the conductive layer comprises a metal or consists of metal. Preferably the conductive layer is metallic, i.e., has metallic properties regarding the mode of the chemical bonding, the heat conductivity and the electrical conductivity.

In an embodiment of the invention the conductive layer comprises an elemental metal or consists of an elemental metal. Preferably the metal is selected from the group consisting of copper, silver and gold and mixtures thereof and alloys thereof. In some cases, the conductive layer may comprise more than one metal. Two or more metals may be for example present in the conductive layer as an alloy.

In some embodiments the conductive layer may comprise a conductive polymer or consists of a conductive polymer.

In a further embodiment of the invention the conductive layer coated on the recess surface is part of an electromagnetic interference (EMI) shielding. Therefore, the conductive layer does not exclusively coat a surface of the recess but further extends across the surface of the dielectric material outside the recess. Preferably the EMI shielding is effective for the whole of the electronic components in the electronic module or for a group of electronic components. Electromagnetic interference shielding in this context means that electromagnetic radiation in the RF frequency range across this conductive layer is reduced by at least 5 dB. In a preferred embodiment the electromagnetic radiation is reduced by at least 10 dB, more preferably by at least 20 dB and most preferably by at least 30 dB. In particular, the conductive layer may constitute an EMI shielding for at least one electronic component of the electronic module.

In another preferred embodiment the conductive layer has a dampening factor for radiation with frequencies above 1 GHz of at least 20 dB, more preferably of at least 30 dB. For example, the electromagnetic radiation to be reduced may include frequencies of at least 50 GHz or even at least 100 GHz.

In some embodiments, the conductive layer constituting an EMI shielding covers in the range of 40 to 95%, e.g., 50 to 90% or 60 to 95% of the accessible surface of the dielectric material of the electronic module. The accessible surface of the dielectric material may be understood as the surface of the dielectric material which is not in direct contact with the substrate. Preferably the conductive layer is a homogenous conductive layer having substantially no holes. Substantially no holes may be understood as no intentionally added pin holes in the conductive layer created during the production process. A pin hole can be considered to be a defect which enables leakage of EMI through the conductive layer. Alternatively, the term "no holes" may be understood as a situation where no pin holes are present which reduce EMI shielding performance of the conductive layer. Intentionally produced areas on the surface of the electronic module which do not comprise a conductive layer and which are designed to allow electromagnetic radiation to pass through shall not be understood as holes.

In a preferred embodiment of the invention the conductive layer on the surface of the recess is part of an EMI shielding. This means that the conductive layer is also present on the dielectric material outside the recess. In an embodiment according to the invention where the conductive layer is also present outside the recess, the thickness of the conductive layer outside the recess and the thickness of the conductive layer in the recess do not differ by more than a factor of three, preferably not more than two.

In some embodiments, a cover layer can be superimposed on the conductive layer. The cover layer can be positioned on the top, bottom and/or side of the electronic module, or a combination of the aforementioned surfaces in order to ensure electrical and/or environmental insulation to the electronic module.

In a possible embodiment of the invention the conductive layer is prepared by inkjet printing. In a further preferred embodiment, the EMI shielding, i.e., the conductive layer outside the recess, to which the conductive layer is electrically connected is formed by inkjet printing.

In an embodiment the conductive layer may be produced by stacking consecutive layers of inkjet-printed material. This can be particularly useful to increase the thickness of the conductive layer.

In a second aspect the invention relates to a process for producing an electronic module having at least two electronic components mounted on a substrate, wherein the electronic components are covered by a dielectric material, wherein the electronic module comprises a recess in the dielectric material between adjacent electronic components, wherein the surface of the recess facing at least one electronic component is coated with a conductive layer while the opposite surface to that coated recess surface is substantially free of a conductive layer and wherein the conductive layer is produced by inkjet printing of an ink composition.

The production of the conductive layer on the surface by inkjet printing has certain advantages. In particular the inkjet printing can be used for forming a conductive layer inside the recess and further can be used to form a conductive layer outside the recess. This reduces the number of machines necessary to produce an EMI shielding. Furthermore, by using inkjet printing of an ink composition the amount of expensive metal material can be reduced, compared to filling techniques.

In a preferred embodiment the process of the invention produces an electronic module according to the first aspect of the invention. In an embodiment of the invention the requirements for the electronic module in the process are the same as for the first aspect of the invention.

The electronic module of the invention comprises at least one recess in the dielectric material between adjacent electronic components. Preferably the recess is a trench. According to the invention a surface of the recess facing at least one electronic component is coated with a conductive layer. The conductive layer is produced by inkjet printing.

The surface of the recess facing at least one electronic component is coated with a conductive layer while the opposite surface to the coated surface is substantially free of a conductive layer.

In this context the term "substantially free" means that the opposite surface does not exhibit a continuous conductive layer over this opposite surface of the recess. In particular this opposite surface does not exhibit a layer which provides EMI shielding properties. This scenario may not exclude that some traces or isolated spots of conductive material which stem from the ink composition are present on this "substantially free" surface.

In an embodiment of the invention inkjet printing utilizes at least one nozzle and the at least one nozzle is configured such that the ink ejected by the at least one nozzle hits the surface of the recess to be coated at an angle theta ($\theta$) of 5°-15° relative to the recess surface. The angle theta is formed between the surface plane of the recess surface and the projection of the inkjet at the spot of where the ink hits the surface. Preferably the angle theta is in the range from 7°-12°. In this connection reference is made to FIG. 3 which illustrates a cross section of a module having a recess in the dielectric material 20. A recess surface is coated via inkjet printing. The angle theta ($\theta$) describes the angle between the surface level 55 of the recess and the inkjet 80 ejected by the nozzle 70, at the point where the inkjet hits the recess surface.

Figure 3:
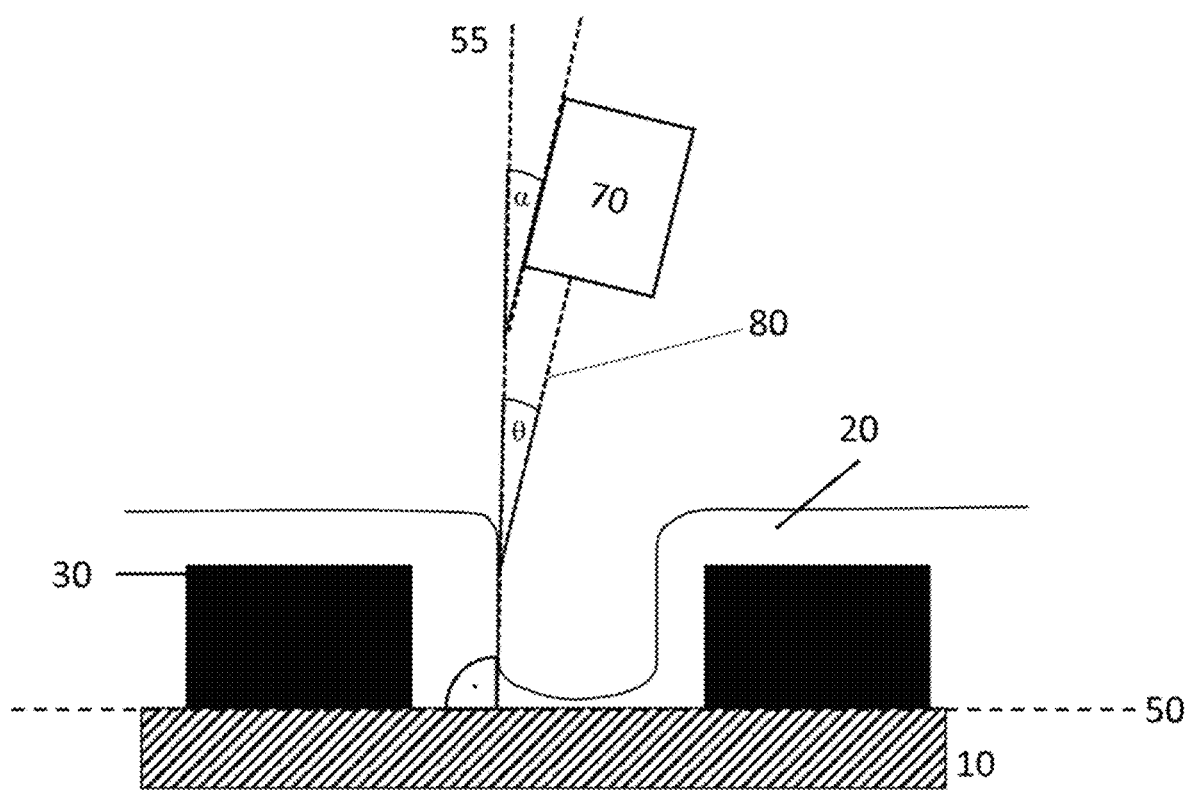
FIG. 3 shows another exemplary schematic cross section of the electronic module illustrating the process for producing the conductive layer.

In order to achieve the tilt of the inkjet 80, in some embodiments the nozzle 70 may be tilted by an angle alpha ($\alpha$) in the range from 5°-15° relative to the surface level 55 of the recess (see FIG. 3). In some cases, the angle alpha ($\alpha$) and the angle theta ($\theta$) may be the same or alternatively the angle theta ($\theta$) can be smaller than the angle alpha ($\alpha$).

The printing parameters for applying the ink may vary in a wide range depending on the actual technical application.

Exemplary printing parameters according to the invention may include on or more of the following parameters:
  a) The ink drop size for printing preferably is in the range from 5-10 pL; and
  b) The resolution which is used for printing is for example selected to be in the range from 600 to 1,800 dpi but depending on the technical requirements it may be higher or lower.

The applied ink composition can be cured by light with a wavelength in the range from 100 nm to 10 µm. In some examples the curing can be done with light in the UV-range from 100-400 nm. In other examples the curing can be done in the visible range from 400-800 nm and in yet another example the curing can be done at wavelengths in the range from 800 nm to 10 µm.

The process of the invention requires an ink composition. In an embodiment of the invention the ink composition comprises at least these constituents:
  a) A compound comprising at least one metal precursor or a combination of two or more thereof; and
  b) At least one organic compound, which is a liquid at room temperature and ambient pressure and which is preferably a volatile organic compound.

The amounts of all constituents of the ink composition sum always up to 100 wt.-%.

The ink composition can comprise further constituents, such as, e.g., adhesion promoter, viscosity aid, and organic solvent.

In some embodiments, the organic compound comprises at least a terpene, for example a terpene having in the range from 5 to 20 or from 5 to 12 carbon atoms, or a combination of two or more terpenes.

A terpene in the present context is a naturally occurring unsaturated hydrocarbon that can be isolated from natural substances and whose structure can be traced back to one or more isoprene units. Today, some terpenes can also be obtained industrially and artificially. The polymers of cis- and trans-polyisoprene are usually not regarded as terpenes. The terpene is preferably an acyclic terpene or a cyclic terpene. Monocyclic terpenes are preferred among the cyclic terpenes. Preferably the terpene is free of heteroatoms. In an alternative embodiment of the invention the terpenes may include oxygen and/or nitrogen atoms.

According to a preferred design, the terpene is selected from the group consisting of orange terpene, limonene and pinene or a combination thereof.

Orange terpene is a liquid mixture of terpenes having a boiling temperature in the range from 170 to 180° C. (p=1 bar), which is normally obtainable by cold pressing orange peels. Orange terpene contains more than 80% by weight, preferably more than 85% by weight and particularly preferably more than 90% by weight of (+)/(−)-limonene. Other components of orange terpene often include aldehydes such as octanal, decanal, sinensal and octyl acetate and neryl acetate. A supplier of orange terpene (CAS No. 68647-72-3) is Carl Roth GmbH, 76231 Karlsruhe, Germany.

A pinene in the present context is a monoterpene hydrocarbon with the molecular formula C10H16. A particularly preferred pinene is β-Pinene (CAS no. 19902-08-0).

Limonene in the present context contains (r)-(+)-limonene, (s)-(−)-limonene, as well as a mixture of the two in any ratio, for example as a racemic mixture.

In some embodiments, the metal precursor has a decomposition temperature in the range from 50 to 500° C., e.g., in the range from 80 to 500° C., or in the range from 150 to 500° C., or from 180 to 350° C., or from 150 to 300° C., or from 180 to 270° C.

In some embodiments, the metal precursor is characterized by at least one of these features:
a) At least a metal cation which is selected from the group consisting of silver, copper and gold, or a combination of any two of them, or all three; and
b) At least an anion which is selected from the group consisting of carboxylate, carbamate, formate and nitrate;
or a combination of two or more elements with any two or more of the features according to a) and b).

In some embodiments, a combination of two or more metal precursors, of the same metal cation but two or more different anions of the same or different type can be used. For example, this includes a combination of a silver carboxylate and a copper salt, a combination of two different silver carboxylates as well as a combination of a silver carboxylate and a silver carbamate, and the like.

A carboxylate in this context is a salt of a carboxylic acid, which is composed of one or more metal cations and one or more carboxylate anions. The carboxylic acid part of the carboxylate anion can be linear or branched, or have cyclic structural elements, or be saturated or unsaturated. Mono- and dicarboxylates, cyclic carboxylates and ketocarboxylates are further preferred types of carboxylates. The carboxylate is usually a solid at room temperature. If the composition according to the invention is liquid or a mixture with solid and liquid components, at least part of the silver carboxylate may have changed to a completely dissolved form. A liquid composition in this context may comprise one or more liquid organic compounds.

In an embodiment, linear, saturated carboxylates are preferred, for example carboxylates having 1 to 20 carbon atoms, or having 7 to 16 carbon atoms, which always includes the carbon atom of the carboxylate group. Such linear carboxylates can be selected from the group consisting of acetate, propionate, butanoate, pentanoate, hexanoate, heptanoate, octanoate, nonanoate, decanoate, undecanoate, dodecanoate, tetradecanoate, hexadecanoate, and octadecanoate. In another embodiment, saturated iso-carboxylates and saturated neo-carboxylates having 1 to 20 carbon atoms or having 7 to 16 carbon atoms can be used. Neo-carboxylates with 5 or more carbon atoms are preferred in some embodiments, such as neopentanoate, neohexanoate, neoheptanoate, neooctanoate, neononanoate, neodecanoate and neododecanoate. The corresponding neocarboxylic acids are produced, for example, by Shell or Exxon.

In some embodiments, silver is the preferred metal cation and a preferred group of carboxylates are silver carboxylates. Of these, linear, saturated carboxylates are preferred, for example carboxylates having 1 to 20 carbon atoms, or having 7 to 16 carbon atoms, which always includes the carbon atom of the carboxylate group. Such linear carboxylates can be selected from the group consisting of silver acetate, silver propionate, silver butanoate, silver pentanoate, silver hexanoate, silver heptanoate, silver octanoate, silver nonanoate, silver decanoate, silver undecanoate, silver dodecanoate, silver tetradecanoate, silver hexadecanoate, and silver octa-decanoate. In another embodiment, saturated silver iso-carboxylates and saturated silver neo-carboxylates having 1 to 20 carbon atoms or having 7 to 16 carbon atoms can be used. Silver neocarboxylates with 5 or more carbon atoms are particularly preferred, such as silver neopentanoate, silver neohexanoate, silver neoheptanoate, silver neooctanoate, silver neononanoate, silver neodecanoate and silver neododecanoate.

A carbamate in this context is a salt of carbamic acid. A formate in this context is a salt of formic acid, e.g., silver and copper formiate. In some embodiments, a nitrate can be the metal precursor, e.g., silver nitrate and copper nitrate.

In some embodiments the ink composition may optionally contain one or more further components, for example, selected from the group consisting of an adhesion promoter, viscosity aid, organic solvent such as glycol ether, and additives. The sum of all constituents of the ink composition always gives 100% by weight.

Glycol ethers are organic substances which have at least one ethylene glycol unit or one diethylene glycol unit. Propylene glycol ether or dipropylene glycol ether are particularly preferred as glycol ethers. Commercially available examples are Dowanol PNP (propylene glycol n-propyl ether) and Dowanol PnB (propylene glycol n-butyl ether), Dowanol DPnB (dipropylene glycol n-butyl ether) and Dowanol DPnP (dipropylene glycol n-propyl ether).

A colophony resin or derivatives thereof are suited viscosity aids with regard to the ink composition. A particularly preferred commercial product is balsamic resin, available from H. Reynaud & Fils GmbH, Hamburg.

In some embodiments, the ink composition may contain further additives with a proportion by weight in the range from 0.05 to 3 wt. %, more preferably in the range from 0.05 to 1 wt. %, the wt. % being based in each case on the total weight of the ink composition. All chemical substances and mixtures which are known to the expert and appear suitable for the intended purpose may be considered as further additives. Silicone-containing additives, for example one or more containing polyether-modified polydimethylsiloxane, are particularly preferred as further additives. Such additives are, for example, available under the brand name BYK from BYK Additives & Instruments GmbH, 46483 Wesel.

In some embodiments, the amount of metal in the ink composition is in the range from 1 to 60 wt. %, e.g., from 1 to 50 wt. %, or from 10 to 30 wt. %, or from 30 to 50 wt.-% based on the total weight of the ink composition, always determined by thermogravimetric analysis (TGA).

In some embodiments, at least 80 wt.-%, e.g. at least 90 wt.-% or at least 95 wt. %, up to 99 or 100 wt.-% of the ink composition comprises one or more constituents selected from the group consisting of a silver carboxylate and a terpene, or a combination thereof.

In some embodiments, the ink composition has a weight ratio of silver to the sum of the elements gold, rhodium, vanadium, palladium, platinum, osmium, copper, tungsten, bismuth, silicon, zirconia, tin, copper and aluminum, greater than 100:1, preferably greater than 150:1, relative to the weight proportions in the ink composition.

In further embodiments, the ink composition has a silver to rhodium weight ratio of more than 100:1, preferably more than 150:1, relative to the weight proportions in the ink composition.

In some embodiments, the total weight percentage of constituents of the ink composition containing one or more of the elements selected from the group consisting of gold, rhodium, vanadium, palladium, platinum, osmium, tungsten, bismuth, silicon, zirconia, tin, copper and aluminum, is less than 10% by weight, preferably less than 8% by weight or 6% by weight, more preferably less than 5% by weight and most preferably less than 2% by weight or less than 1% by weight, the percentages by weight being always based on the total weight of the ink composition.

In another embodiment, the total weight percentage of constituents of the ink composition comprising one or more of the elements selected from the group consisting of rhodium, vanadium and osmium is less than 1 wt. %, preferably less than 0.5 wt. % or less than 0.2 wt. %, the wt. % based on the total weight of the composition.

In some embodiments, the weight ratio of constituent a), silver carboxylate, to constituent b), terpene, in the ink composition is in a range from 4:1 to 1:5, e.g., 1:2 to 2:1, or 1:1 to 1:2, or from about 1:1.5 to about 1:2. Preferably, in the case of component a), silver carboxylate, and in the case of component b), terpene, the weight ratio in the ink composition is in the range from about 1:1.5 to about 1:2. The indication "about" means that within the scope of the indicated accuracy an expert reads all commercially rounded values to the number. In the case of 1:2, for example, this means a range from 1:1.5 to 2:4.9 inclusive, based on the weight of silver carboxylate and terpene. Such values can be determined from a liquid composition, for example from an HPLC measurement, whereby a characteristic signal is selected for each component and put into proportion.

In some embodiments, the sum of the proportions by weight of constituents a), silver carboxylate, and b), terpene, is in the range of 10 to 95 wt. %, or from 10 to 80 wt. %, based on the total weight of the ink composition. Furthermore, the sum of the weight proportions of constituents a) and b) in a range from 35 to 95 wt. %, or from 35 to 80 wt. %, or from 40 to 60 wt. %, most preferably from 45 to 55 wt. %, is preferably the sum of the weight proportions of constituents a) and b) in a range from 35 to 95 wt. %, or from 40 to 60 wt. %, most preferably from 45 to 55 wt. %, the wt. % being in each case based on the total weight of the composition.

In some further embodiments, the proportion by weight of constituent a), silver carboxylate, is in the range from 10 to 80% by weight, preferably from 10 to 60% by weight, or from 15 to 45% by weight, the percentage by weight being based on the total weight of the ink composition.

In a further embodiment, the ink composition may contain at least one, two, three or more carboxylic acids as further constituents. Carboxylic acid can in principle be any carboxylic acid that is known to artisans and appears suitable, in particular one or more tertiary carboxylic acids with 5 or more carbon atoms. One or a combination of several of the following elements may be selected as a tertiary carboxylic acid: neopentanoic acid, neohexanoic acid, neoheptanoic acid, neooctanoic acid, neononanoic acid, neodecanoic acid and neododecanoic acid. Neodecanoic acid, or a combination of neodecanoic acid with one of the other neocarboxylic acids mentioned, is particularly preferred. Neocarboxylic acids are, for example, produced by Shell or Exxon. By adding a carboxylic acid or a combination of several carboxylic acids, the shelf life of the ink composition can be extended.

In some embodiments the carboxylic acid may have the same configuration of carbon atoms as the carboxylate anion which may be present in the composition. This means if, for example, the carboxylate is neoheptanoate then neoheptanoic acid would be added as a further constituent.

In some embodiments, the content of metal particles in the ink composition is less than 1% by weight, or less than 0.5% by weight, or less than 0.2% by weight, based on the total weight of the ink composition. Consequently, the composition according to the invention contains practically no metal particles. Metal particles in this context are in any case solids.

In a further embodiment, the ink composition has a precious metal content which is in a range from 1 to 30 wt. %, based on the total weight of the ink composition. The term "precious metal" refers to the following substances in the context of this invention: gold, silver, mercury, palladium, platinum, rhodium, iridium, ruthenium, osmium, tungsten, bismuth, silicon, zirconia, tin, copper and aluminum.

In some embodiments, the ink composition has a viscosity in the range of from 0.1 to 100 mPas, e.g., from 5 to 70 mPas, determined at a temperature 20° C. and an environmental pressure of 1,013 hPa. In a particularly preferred embodiment, the viscosity is in the range from 5 to 15 mPas at 30° C.

In a third aspect the invention relates to the use of the electronic module according to the first aspect of the invention in a computer device.

In an embodiment of the invention the computer device is selected from the group consisting of a mobile phone, a tablet computer, a notebook, a wearable (e.g., a watch), an embedded computer and a desktop computer.

Referring now to the drawing, in which like reference numbers refer to like elements throughout the various figures that comprise the drawing, FIG. 1 shows a schematic drawing of an inventive electronic module 1 comprising a substrate 10 on which electronic components 30,30' are mounted. The electronic components 30, 30' are covered with a dielectric material 20 and connected by a connector 35. A conductive layer 40 is coated on the dielectric material 20 of a part of the electronic module 1. In this way the electronic component 30' is shielded from the EMI which might originate from the electronic component 30. As can be seen the surface of a recess 25 facing one electronic component 30' is coated with the conductive layer 40 while the opposite surface of the recess 25 facing the electronic component 30 does not exhibit a conductive layer 40.

Figure 2:
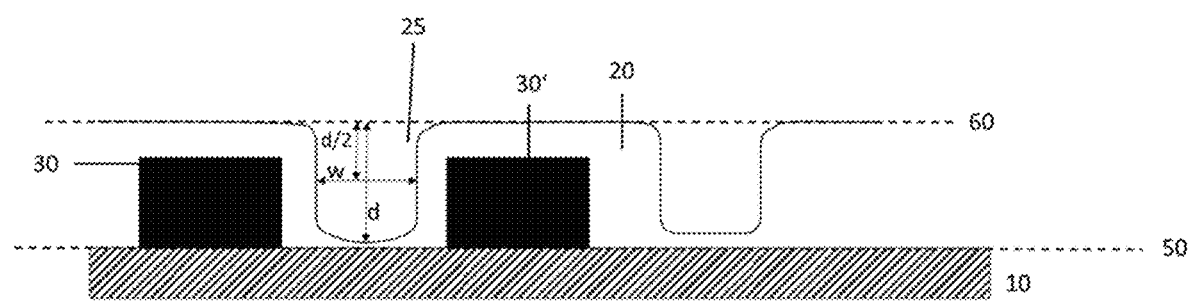
FIG. 2 shows an exemplary schematic cross section of the electronic module illustrating the aspect ratio of the recess.

FIG. 2 shows a schematic cross section of the electronic module 1 of the invention. It illustrates the determination of the aspect ratio of the recess 25. The recess 25 is located between adjacent electronic components 30, 30'. The depth d of the recess 25 extends from the average surface level 60 of the electronic module 1 to the lowest point of the recess 25. The full width w is measured at half the depth d/2. A substrate plane 50 indicates the level of the substrate 10 relative to which the cross section of the recess 25 is oriented perpendicular.

FIG. 3 shows another exemplary schematic cross section of the electronic module 1 of the invention wherein the process for producing the conductive layer 40 of the invention is displayed. Here the determination of the angle theta (θ) is depicted. A nozzle 70 ejects a jet 80 of an ink composition. The jet 80 hits the surface of the recess 25 at an angle theta (θ) relative to the surface level 55 of the recess surface. In the exemplary drawing of FIG. 3, the surface level 55 of the recess 25 is oriented perpendicular to the substrate plane 50. The angle alpha (α) indicates the tilt of the nozzle 70 relative to the surface level 55 of the recess 25.

FIG. 4 shows a top view of the electronic module 1 having several recesses 25 in the form of trenches. The two-headed arrows indicate the extension direction of the cross section which stands perpendicular to the substrate plane 50 (not shown). According to this FIG. 4, the cross sections extend perpendicular to the drawing plane of this figure. The dashed lines in FIG. 4 indicate that the recesses 25 in the form of trenches can extend along a straight line (scenario a) and scenario b)) or alternatively the recess 25 in the form of a trench can extend along an angled line (scenario c)).

FIG. 5 shows a schematic drawing of an electronic module 1 of the invention in a perspective view. The mounted electronic components 30, 30' are covered by the dielectric material 20. The conductive layer 40 shields one group of electronic components 30' from EMI while another group of electronic components 30 is not shielded under the conductive layer 40. Between adjacent electronic components 30, 30' extends the recess 25. One surface of the recess 25 is coated with the conductive layer 40 while the opposite surface of the recess 25 does not exhibit the conductive layer 40. The annotations of the previous FIGS. 1-4 apply. What can be seen in particular in this view is the substrate plane 50 which extends along the surface of the substrate 10.

Figure 6:
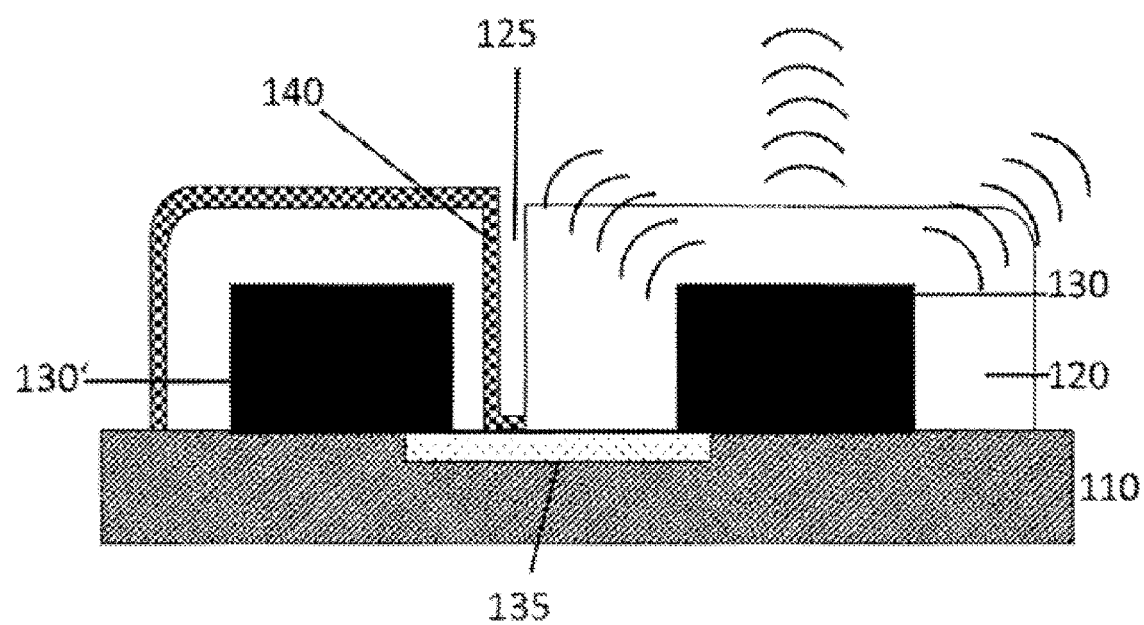
FIG. 6 shows a schematic drawing of an electronic module according to an alternative embodiment of the invention.

FIG. 6 shows a schematic drawing of an alternative example of an electronic module similar to that shown in FIG. 1 with 100 series reference numerals being used to designate similar components. In FIG. 6 the conductive layer 140 is coated on the surface of the recess 125 facing one electronic component 130' and on a bottom of the recess 125 while the opposite surface of the recess 125 facing the electronic component 130 does not exhibit the conductive layer 140.

Test Methods

The following methods were used to test the disclosed invention.

a. Determination of Metal Content

An inductively coupled plasma (ICP) was coupled with optical emission spectrometry (OES) for evaluation. Typical determination limits according to the method used here were 1 ppm (related to the weighed sample quantity). The determination of the element concentration with the measuring instrument was carried out according to the specifications of the instrument manufacturer (ICP-OES: VARIAN Vista MPX) and using certified reference liquids for calibration. The element concentration in the solution (100 ml) determined by the instruments was then converted to the original sample weight (0.1 g).

The sample to be analyzed was dissolved with aqua regia (a mixture of 3 parts HCl, 37% by weight and 1 part $HNO_3$, 65% by weight) in a microwave reaction system called MultiwavePro available from Anton Paar.

The following elements can be determined in this way: Ag, Au, B, Bi, Ce, Co, Cr, Cu, Fe, In, Ir, Mn, Ni, Pd, Pt, Rh, Ru, Sb, Si, Sn, Ti, V, Zn, and Zr.

b. Thickness and Variation of Thickness of Electromagnetic Interference Shield Layer The thickness of the conductive layer on the semiconductor package was measured directly by SEM analysis or comparatively using a film printed under the same conditions on glass and measuring the depth of an intentional scratch of a doctor blade with a Dektak DXT-E profilometer. The variation of thickness was derived from the maximum and minimum values of the line scan from the profilometer. The conductivity of the layer was calculated and evaluated against the bulk value of silver ($6.3 \times 10^7$ S/m).

c. Sheet Resistance and Conductivity

For measuring the sheet resistance of an electromagnetic interference shielding layer, a Four-Point Probe available from Ossila of Sheffield, UK was used. The two outer probes of a conductive feature of the layer apply a constant current and two inner probes on the same feature and between the outer probes measure the voltage. The sheet resistance was deduced using the Ohmic law in Ω/□. To determine the average sheet resistance, the measurement was performed on 25 equally distributed spots of the electromagnetic interference shielding layer. In an air conditioned room with a temperature of 22±1° C., all equipment and materials were equilibrated before the measurement. To perform the measurement, the Four Point Probe was equipped with a 4-point measuring head with rounded tips in order to reliably contact the conductive layer. A maximum current of 100 mA was applied. The measurement was started. After measuring 25 equally distributed spots on the electromagnetic interference shielding layer, the average sheet resistance was calculated in Ω/□.

The conductivity of the electromagnetic interference shielding layer was also determined using the four-point probe of Ossila. The sheet resistance was measured in various orientations, and the conductivity was calculated by the Ossila four point probe's software upon entering the median film thickness, as determined with the profilometer Dektak DXT-E (Bruker GmbH, Karlsruhe, Germany).

Examples

The following examples are included to more clearly demonstrate the overall nature of the disclosure. The examples are exemplary, not restrictive, of the disclosure.

An uncoated electronic module encapsulated with silica-sphere filled epoxy novolac resin was provided. Two kinds of trenches were cut with a dicing saw, available from DISCO HI-TEC Europe GmbH. Two samples had different widths of the trench. (Example 1: width=150 μm, height=1,000 μm; Example 2: width=300 μm, height=1,000 μm). The surfaces were cleaned using a plasma cleaner AP-600 available from Nordson March, Concord (CA), USA, with 400 W plasma power for 90 s in an atmosphere of a reduced pressure of 90 mbar, the atmosphere containing 20 vol. % oxygen and 80 vol. % argon.

Next, the top surface of the electronic module was printed using:

An EMI inkjet printer equipped with an inkjet head able to print 7 pL droplets, aligned perpendicular to the substrate plane;

An ink consisting of 50 wt. % Ag neodecanoate and 50 wt. % limonene (DL-Limonene, CAS-No. 138-86-3, available from Merck KGaA), based on the total weight of the ink composition;

A printing resolution of 1,200/600 dpi; and

A UV Light source HERAEUS SEMRAY UV 4103.

The surface of the trench adjacent to the printed top surface was coated with the nozzle (i.e., the print head) tilted by 10° to the surface normal of the substrate plane.

The printed layer was subsequently cured using the UV Light source HERAEUS SEMRAY UV 4103 and a homogeneous silver layer was obtained.

The sheet resistance of the electromagnetic interference shielding layer was measured using a four-point probe system available from Ossila Ltd. of Sheffield, UK, by measuring the sheet resistance in various orientations and at different positions (top of module, each side of coated trench), and calculation of the specific conductance by the system upon entering the median film thickness as determined by SEM.

The conductivity was determined to be $3 \times 10^7$ S/m.

TABLE 1

|  | Top surface | Coated trench wall |
| --- | --- | --- |
| Layer Thickness | 1.5 μm | 1 μm |
| Sheet Resistance | 5.8 mΩ/□ | 7.5 mΩ/□ |

Table 1 shows the characterization results for Example 1 from the thickness measurements and the resistance measurements of the prepared conductive layer. As can be seen from Table 1, the conductive layer prepared by the process of the invention has a low sheet resistance which is highly suitable for shielding electronic components from electromagnetic interference.

Although illustrated and described above with reference to certain specific embodiments and examples, the present disclosure is nevertheless not intended to be limited to the details shown. Rather, various modifications may be made in the details within the scope and range of equivalents of the claims and without departing from the spirit of the disclosure.

What is claimed:

1. An electronic module comprising:
   a substrate defining a substrate plane;
   at least two electronic components mounted on the substrate adjacent to each other;
   a dielectric material covering the electronic components and defining a recess between the adjacent electronic components with a first surface facing one of the electronic components and a second surface opposite the first surface; and
   a conductive layer coating the first surface of the recess and at least a portion of the dielectric material outside the recess, wherein the second surface of the recess is substantially free of the conductive layer, wherein a thickness of the conductive layer in the recess and a thickness of the conductive layer outside the recess do not differ by more than a factor of two, and wherein the first and second surfaces of the recess are oriented at an angle of 90°-5° with respect to the substrate plane.

2. The electronic module according to claim 1 wherein the recess has at least one cross section perpendicular to the substrate plane with an aspect ratio of 7 or less.

3. The electronic module according to claim 1 wherein the recess is a trench.

4. The electronic module according to claim 1 wherein the recess has a bottom and the bottom is coated with the conductive layer.

5. The electronic module according to claim 1 wherein the conductive layer comprises a metal or consists of metal.

6. The electronic module according to claim 1 wherein the recess has a full width at half-maximum in the range from 20-400 μm.

7. The electronic module according to claim 6 wherein the recess has a full width at half-maximum in the range from 50-250 μm.

8. The electronic module according to claim 1 wherein the conductive layer coating the first surface of the recess is part of an electromagnetic interference shielding for at least one electronic component of the electronic module.

9. The electronic module according to claim 8 wherein the electromagnetic interference shielding has a sheet resistance of 20 mOhm/□ or less.

10. The electronic module according to claim 1 wherein the conductive layer has a dampening factor for radiation with frequencies above 1 GHz of at least 20 dB.

11. The electronic module according to claim 1 wherein the conductive layer coating the first surface of the recess has a thickness of 5 nm or more and 5 μm or less.

12. A process for producing an electronic module having at least two electronic components mounted on a substrate, the process comprising:
   providing the substrate defining a substrate plane;
   mounting the at least two electronic components on the substrate;
   covering the at least two electronic components with a dielectric material while defining a recess between the at least two electronic components with a first surface facing one of the at least two electronic components and a second surface opposite the first surface, wherein the first and second surfaces of the recess are oriented at an angle of 90°-5° with respect to the substrate plane; and
   inkjet printing an ink composition to produce a conductive layer wherein the first surface of the recess and at least a portion of the dielectric material outside the recess are coated with the conductive layer while the second surface of the recess is substantially free of the conductive layer, wherein a thickness of the conductive layer in the recess and a thickness of the conductive layer outside the recess do not differ by more than a factor of two.

13. The process according to claim 12, wherein the step of inkjet printing utilizes at least one nozzle and the at least one nozzle is configured such that the inkjet ejected by the at least one nozzle hits the first surface of the recess to be coated at an angle theta (θ) of 5°-15° relative to the first surface.

14. The process according to claim 12, wherein the recess is defined in at least one cross section to have an aspect ratio of 7 or less.

15. The process according to claim 14, wherein the recess is defined in at least one cross section to have an aspect ratio of 3 or less.

16. The process according to claim 12, wherein the ink composition comprises at least these constituents: (a) a compound comprising at least one metal precursor; and (b) at least one organic compound which is a liquid at room temperature and ambient pressure.

17. The process according to claim 16, wherein the at least one metal precursor comprises at least one element selected from the group consisting of silver, gold, and copper.

18. The process according to claim 16, wherein the at least one organic compound comprises an organic solvent.

19. A method of using the electronic module according to claim 1 in a computer device.

20. The method according to claim 17, wherein the computer device is selected from the group consisting of a phone, a tablet computer, a notebook, a wearable including a watch, an embedded computer, or a desktop computer.

\* \* \* \* \*